US009576900B2

(12) United States Patent
Dosluoglu

(10) Patent No.: US 9,576,900 B2
(45) Date of Patent: Feb. 21, 2017

(54) SWITCHED POWER STAGE WITH INTEGRATED PASSIVE COMPONENTS

(71) Applicant: ENDURA TECHNOLOGIES LLC, San Diego, CA (US)

(72) Inventor: Taner Dosluoglu, New York, NY (US)

(73) Assignee: Endura Technologies LLC, San Diego, CA (US)

( * ) Notice: Subject to any disclaimer, the term of this patent is extended or adjusted under 35 U.S.C. 154(b) by 0 days.

(21) Appl. No.: 15/042,097

(22) Filed: Feb. 11, 2016

(65) Prior Publication Data

US 2016/0233192 A1    Aug. 11, 2016

Related U.S. Application Data

(60) Provisional application No. 62/115,090, filed on Feb. 11, 2015.

(51) Int. Cl.
| | |
|---|---|
| H01L 23/528 | (2006.01) |
| H01L 23/00 | (2006.01) |
| H01L 23/64 | (2006.01) |
| H01L 23/522 | (2006.01) |
| H01L 23/498 | (2006.01) |
| H05K 1/18 | (2006.01) |

(52) U.S. Cl.
CPC ......... *H01L 23/528* (2013.01); *H01L 23/5227* (2013.01); *H01L 23/645* (2013.01);
(Continued)

(58) Field of Classification Search
CPC .. H01L 23/528; H01L 23/645; H01L 23/5227; H01L 2924/19103; H01L 2924/15159; H01L 2924/19042; H01L 24/16; H01L 2224/16235; H01L 2224/16227; H01L 2224/13147; H01L 24/13;H01L 2924/14; H01L 2924/15311; H01L 2224/16265; H01L 2924/00; H01L 2224/48227; H01L 2224/73265; H01L 2224/16225; H01L 2224/48247; H01L 2224/32145; H01L 2224/0401; H01L 2224/131; H01L 24/11; H01L 2225/1058; H01L 2924/15153; H01L 2224/48137; H01L 23/49822; H01L 2924/1517; H01L 2225/06513; H05K 1/185; H05K 2201/10674
(Continued)

(56) References Cited

U.S. PATENT DOCUMENTS 6,362,525 B1 * 3/2002 Rahim .............. H01L 23/49838
257/528
2004/0217443 A1    11/2004 Davies
(Continued)

OTHER PUBLICATIONS

International Search Report on related PCT Application No. PCT/US2016/017631 from International Searching Authority (KIPO) dated May 30, 2016.
(Continued)

*Primary Examiner* — Caleen Sullivan
(74) *Attorney, Agent, or Firm* — Klein, O'Neill & Singh, LLP

(57) ABSTRACT

A scalable switching regulator architecture has an integrated inductor. In some embodiments an area and current drive capability of switches of the switching regulator is matched with an inductor built within an area above the switches. In some embodiments the combined switches and inductor are constructed as a unit cell and can be combined to form larger elements as required for higher current drive capability and multiphase operation.

14 Claims, 11 Drawing Sheets

(52) U.S. Cl.
CPC ........ *H01L 23/49822* (2013.01); *H01L 24/13* (2013.01); *H01L 24/16* (2013.01); *H01L 2224/13147* (2013.01); *H01L 2224/16227* (2013.01); *H01L 2224/16235* (2013.01); *H01L 2224/16265* (2013.01); *H01L 2224/32145* (2013.01); *H01L 2224/48227* (2013.01); *H01L 2224/48247* (2013.01); *H01L 2224/73265* (2013.01); *H01L 2225/06513* (2013.01); *H01L 2225/1058* (2013.01); *H01L 2924/00* (2013.01); *H01L 2924/14* (2013.01); *H01L 2924/15159* (2013.01); *H01L 2924/15311* (2013.01); *H01L 2924/19042* (2013.01); *H01L 2924/19103* (2013.01); *H05K 1/185* (2013.01); *H05K 2201/10674* (2013.01)

(58) Field of Classification Search
USPC ........................................................ 257/531
See application file for complete search history.

(56) References Cited

U.S. PATENT DOCUMENTS

| | | | |
|---|---|---|---|
| 2008/0150623 | A1 | 6/2008 | Lin et al. |
| 2009/0289722 | A1 | 11/2009 | Dropmann et al. |
| 2010/0033236 | A1 | 2/2010 | Triantafillou et al. |
| 2011/0018126 | A1 | 1/2011 | Kling et al. |
| 2011/0215464 | A1* | 9/2011 | Guzek ................... H01L 21/568 257/737 |
| 2011/0298088 | A1 | 12/2011 | Elian et al. |
| 2012/0267756 | A1 | 10/2012 | Shi et al. |
| 2013/0049224 | A1* | 2/2013 | Sutardja ................. H01L 23/13 257/774 |
| 2014/0246753 | A1 | 9/2014 | Song et al. |
| 2015/0162297 | A1 | 6/2015 | Cho et al. |
| 2015/0206837 | A1 | 7/2015 | Gu et al. |
| 2015/0279545 | A1 | 10/2015 | Fazelpour et al. |
| 2015/0279920 | A1 | 10/2015 | Zuo et al. |
| 2015/0279921 | A1 | 10/2015 | Lam et al. |
| 2015/0303810 | A1 | 10/2015 | Chang et al. |
| 2015/0311271 | A1* | 10/2015 | Erturk ..................... H01L 28/10 336/229 |

OTHER PUBLICATIONS

Written Opinion on related PCT Application No. PCT/US2016/017631 from International Searching Authority (KIPO) dated May 30, 2016.

* cited by examiner ated Passive Components

CROSS REFERENCE TO RELATED APPLICATION

This application claims the benefit of the filing date of U.S. Provisional Patent Application No. 62/115,090, filed on Feb. 11, 2015, the disclosure of which is incorporated by reference herein.

BACKGROUND OF THE INVENTION

The present invention relates generally to switching regulators for regulating power to semiconductor circuitry, and more particularly to integrated inductors for switching regulators.

A power distribution network in a typical System-on-chip (SoC) used in various mobile devices includes on-chip metallization layers connecting to a package substrate via micro-bumps or copper pillars. Signals from or to the micro-bumps or copper pillars are generally routed within the package using one or more redistribution layers (RDL) to balls of the package that connect to a printed circuit (PCB). This may result in a significant parasitic inductance, which may be a significant limiting factor in the performance of these devices as the higher frequencies and higher currents generate local transient effects which are also referred to as droops due to fast changes in the load currents.

The use of embedded voltage regulators (eVRs), typically switching regulators with inductors, may be useful in reducing or accounting for variations presented by parasitic inductances. Providing inductors for an eVR implementation with a high inductance to resistance value (L/R: inductance [nH] per resistance [mohms]) in a small form factor (current rating per square millimeter) may be challenging, however.

BRIEF SUMMARY OF THE INVENTION

Some aspects of the invention relate to a scalable switching regulator architecture with an integrated inductor and/or to a methodology to optimize the various performance parameters against area of a structure providing the inductor. Preferably, the area and current drive capability of switches of the switching regulator is matched with an inductor that can be built within the same area above the switches. In some embodiments the combined switches and inductor are constructed as a unit cell and can be combined to form larger elements as required for higher current drive capability and multiphase operation.

One aspect of the invention relates to an integrated chip package comprising: a flip-chip type integrated circuit (IC) chip including a system-on-chip (SoC) and a switching voltage regulator, the switching voltage regulator including at least a first switch and a second switch coupled in series between a higher voltage level connection and a lower voltage level connection; a multi-layer substrate having a cavity with at least one inductor in the cavity, the at least one inductor having a plurality of upper layers of traces interspersed by ferrite material, the inductor including a first end and a second end; and a plurality of micro-bumps connecting the IC chip to the substrate including a micro-bump connecting a node between the first switch and the second switch to the first end of the inductor.

Another aspect of the invention relates to a flip-chip package comprising: a flip-chip type integrated circuit (IC) chip including a system-on-chip (SoC) and a multi-phase voltage regulator, the multi-phase voltage regulator including a first pair of transistors coupled in series and a second pair of transistors coupled in series; and a multi-layer package substrate having a plurality of redistribution layers and a first inductor and a second inductor, the first inductor and the second inductor formed of a plurality of electroplated traces, each of the first and second inductors including a first end and a second end, the plurality of electroplated traces formed of conductive layers within a cavity of the multi-layer package substrate, ferrite material between at least some of the conductive layers, and wherein at least one of the first plurality of electroplated traces is configured to connect the second end of the first inductor to the first end of the second inductor; and a plurality of bumps configured to connect the IC chip to the multi-layer package substrate at a plurality of nodes including a supply node, a ground node, a load output node, and inductor nodes, the load output node including the connection between the second end of the first inductor and the first end of the second inductor, the inductor nodes including a node configured to connect a node between the first pair of transistors to the first end of the first inductor structure and a node configured to connect a node between the second pair of transistors to the second end of the second inductor structure.

These and other aspects of the invention are more fully comprehended upon review of this disclosure.

DETAILED DESCRIPTION

Figure 1:
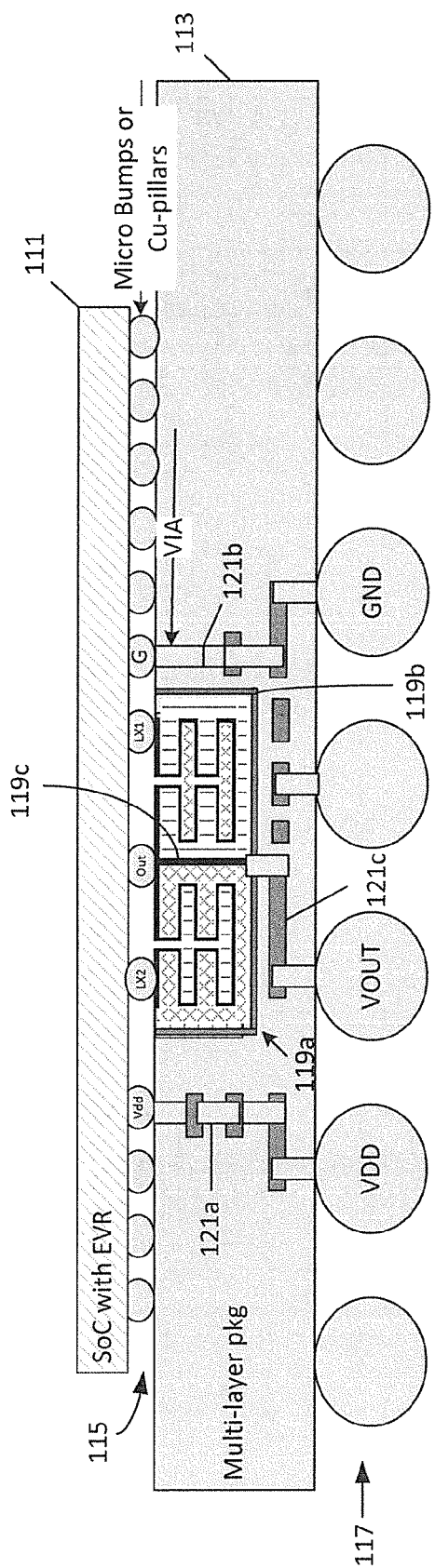
FIG. 1 is a partial cross-sectional view showing a system on chip (SoC) on a multi-layer package substrate, in accordance with aspects of the invention.

FIG. 1 is a partial cross-sectional view showing a system on chip (SoC) 111 on a multi-layer package substrate 113, in accordance with aspects of the invention. The SoC is coupled to a first side of the multi-layer package by way of micro-bumps 115, with a second, opposing, side of the multi-layer package having balls 117 for coupling to a printed circuit board (PCB) (not shown).

The SoC is a semiconductor device that generally includes various circuitry for performing operations, for example one or more processor cores in various embodiments, and, in the case of the SoC 111, an embedded voltage regulator (eVR). The eVR may be, for example, a switching regulator, and the switching regulator may include switches for alternatively coupling one side of an inductor to a higher voltage level and a lower voltage level, with another side of the inductor providing a voltage output node (Vout) providing regulated power to a power domain of the eVR.

The multi-layer package includes redistribution layers (RDLs) including metalized traces and vias coupling various portions of the RDLs and/or micro-bumps and balls. The RDLs and vias are used for routing of signals within the package. The multi-layer package also includes a cavity for inductor structures, with a first inductor 119a and a second inductor 119b shown in FIG. 1. In FIG. 1, metallization 119c separates an area of the first inductor and the second inductor.

In the embodiment of FIG. 1, the micro-bumps include a Vdd bump, for providing the higher voltage level to the eVR of the SoC, and a ground bump, for providing the lower voltage level to the eVR of the SoC. The Vdd bump is coupled to a Vdd ball by way of a via 121a, and the ground bump is coupled to a ground ball by way of a via 121b. The vias 121a and 121b flank opposing sides of the inductors 119a,b.

The micro-bumps also include an output bump providing a common eVR output from the inductors in the multi-layer package substrate to the SoC, and, as shown, two inductor input bumps, LX1 and LX2, for providing inputs to inductors in the multi-layer package substrate. In the embodiment of FIG. 1 multiple inductors are used, with the eVR of the SoC being a multi-phase switching regulator. Although only two inductors of the multi-phase switching regulator are shown in FIG. 1, in many embodiments more than two inductors may be used.

Figure 2:
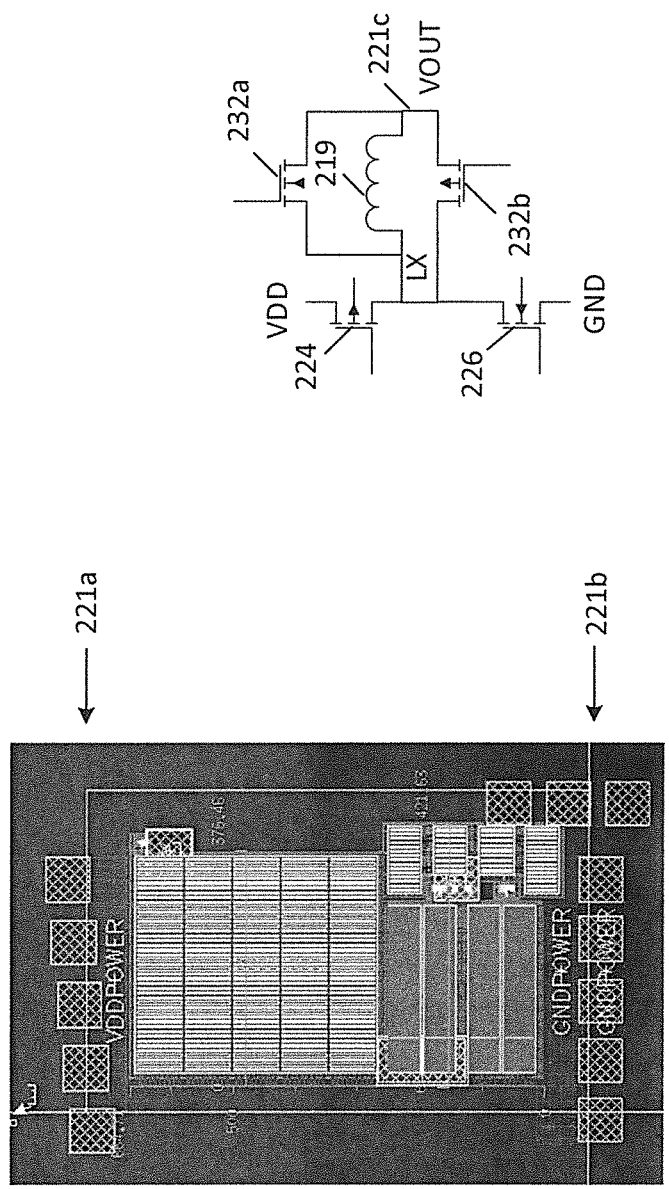
FIG. 2 shows a sample layout of switches of the eVR of FIG. 1, along with a partial circuit diagram of an example single phase switching regulator for explanatory purposes.

FIG. 2 shows a sample layout of switches of the eVR of FIG. 1, along with a partial circuit diagram of an example single phase switching regulator for explanatory purposes. In FIG. 2 a single phase switching regulator is shown for increased clarity, it being understood that a multi-phase switching regulator would include additional switches and inductors. The inductor structure can be built to match the size of these switches. The layout of the eVR of FIG. 2 is for a switching regulator that has a high side (HS) switch and a low side (LS) switch coupled in series between a higher voltage (VDD) and a lower voltage (GND). An inductor (with only a single inductor shown for ease of understanding) has one end coupled to a node (LX) between the HS switch and the LS switch. An output voltage, regulated through operation of the HS switch and the LS switch, is taken from another end of the inductor. In some embodiments, and shown in partial circuit diagram of FIG. 2, bypass switches couple opposing ends of the inductor. The HS switch and the LS switch are located between VDD couplings 221a and GND couplings 221b. As can be seen by way of a comparison with FIG. 1, the inductor structures 119a,b shown in FIG. 1 are also between VDD and GND connections, and the inductor structures are therefore substantially matched to the size of the HS and LS switch structures.

Figure 3:
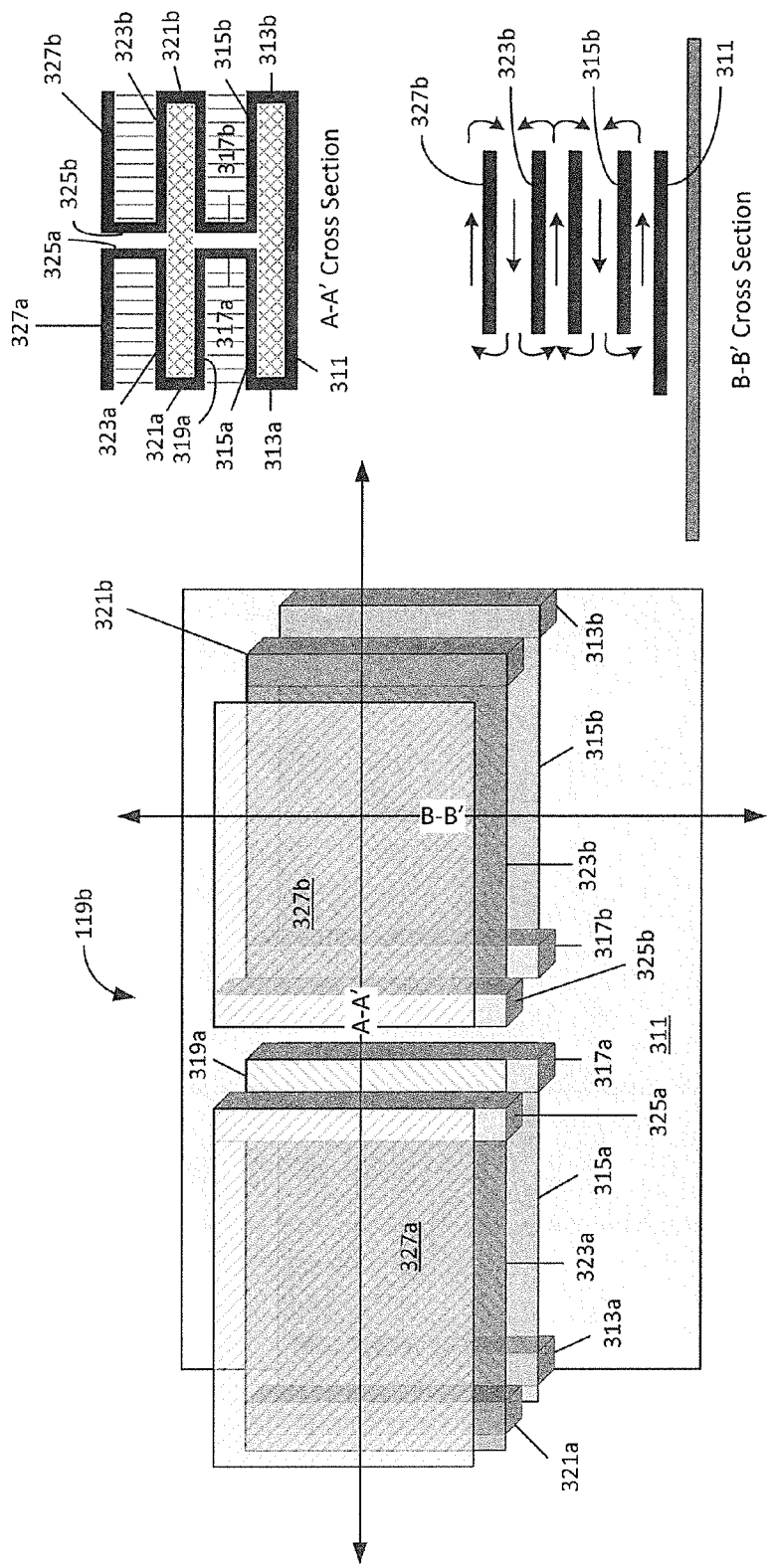
FIG. 3 provides a three dimensional view of an inductor structure, with accompanying cross-sections, in accordance with aspects of the invention.

FIG. 3 provides a three dimensional view of an inductor structure, with accompanying cross-sections, in accordance with aspects of the invention. In some embodiments, and in FIG. 3, the inductor structure is for the inductor 119b of FIG. 1.

The inductor structure includes a planar base 311 of a metal, in some embodiments copper. Copper traces 313a,b, which may be considered copper beams extend vertically upward along opposing edges of the base. A copper platform 315a extends horizontally inward from the copper beam 313a, while a similar copper platform 315b extends horizontally inward from the copper beam 313b. The copper platforms extend towards and close to, but not reaching, each other and a midpoint line defined by a midpoints of a width of the base 311. Further copper beams 317a,b extend vertically upward from inward edges of the copper platforms 315a,b, respectively. Interspersed further copper platforms 319a,b, 323a,b, and 327a,b and still further copper beams 321a,b and 325a,b follow in a serpentine manner to form an inductor. In the embodiment of FIG. 3, gaps between the copper is filled with a ferrite material.

In some embodiments, the structure is formed in a cavity of multi-layer package substrate utilizing, for example, electroplating of copper layers and electrophoretic deposition of ferrite material. Electroplating may be used for forming thick copper traces to reduce the resistance. A layer of ferrite material is electro-deposited on top of the copper traces which produces self-aligned layers of ferrite material on top of the copper traces. The process is repeated until a structure is formed comprised of, and in some embodiments consisting of, copper traces with ferrite material in between the layers. For a 500 um package cavity this can be 5 layers of 20 um thick copper traces with 4 layers of 100 um thick ferrite material in between the layers of copper. In various aspects of the invention, the structure forms an inductor for a switching power regulator.

Figure 4:
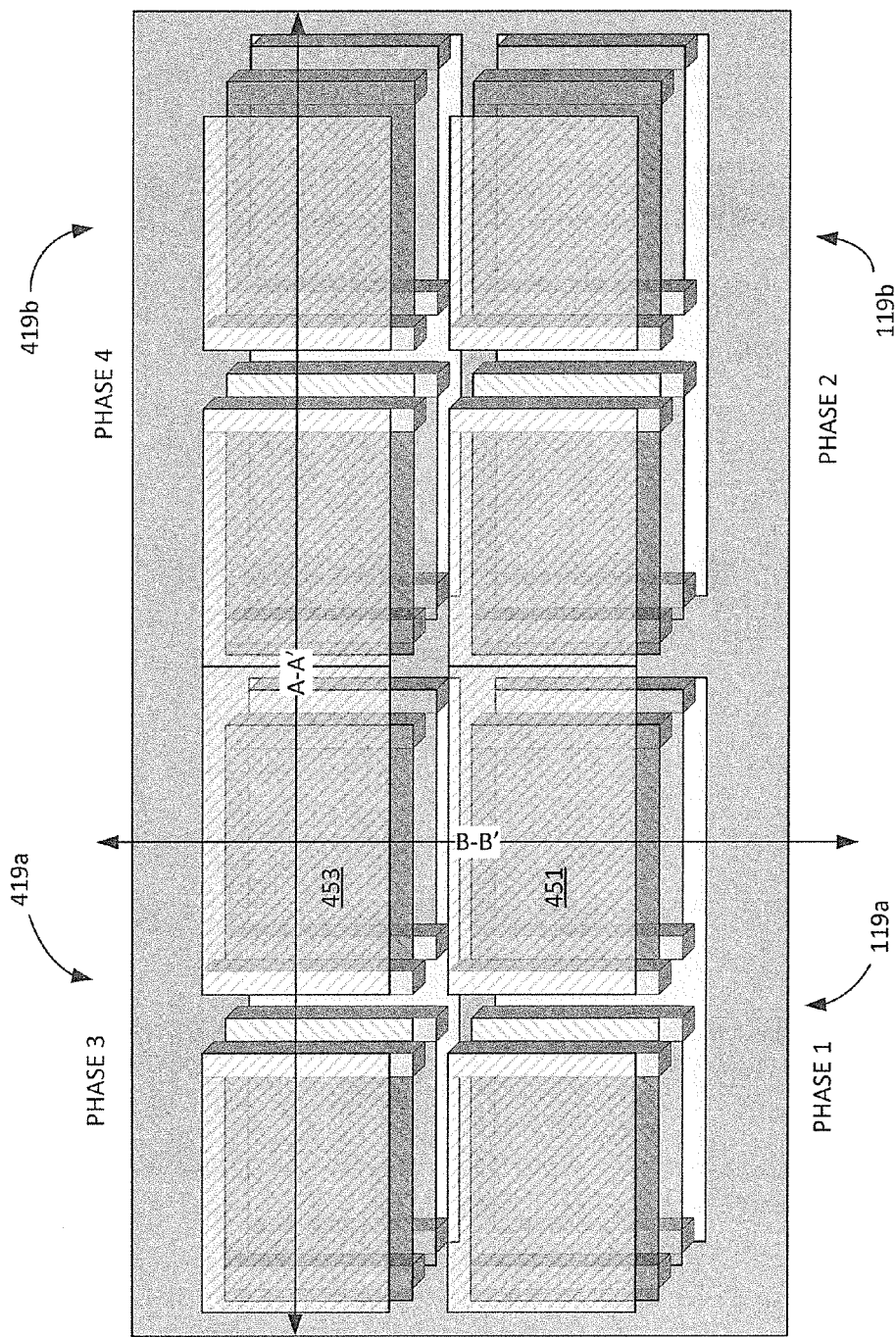
FIG. 4 shows a three dimensional view of a four phase implementation in accordance with aspects of the invention.

An aspect of the structure shown in FIG. 3 is that it allows multi-phase implementation embodiments of the invention with enhanced mutual inductance between phases. FIG. 4 shows a three dimensional view of a four phase implementation in accordance with aspects of the invention. The four phase implementation may be used, for example, in the device of FIG. 1, with the cross-section of FIG. 1 showing inductors of two of the four phases. In FIG. 4, a first inductor 119a corresponds to the inductor 119a of FIG. 1, and a second inductor 119b corresponds to the inductor 119b of FIG. 1. Not visible in FIG. 1 are the inductors 419a and 419b, with the inductors 419a and 419b being located behind the inductors 119a and 119b, respectively. Each of the inductors has the form of the inductor discussed with respect to FIG. 3.

Figure 5:
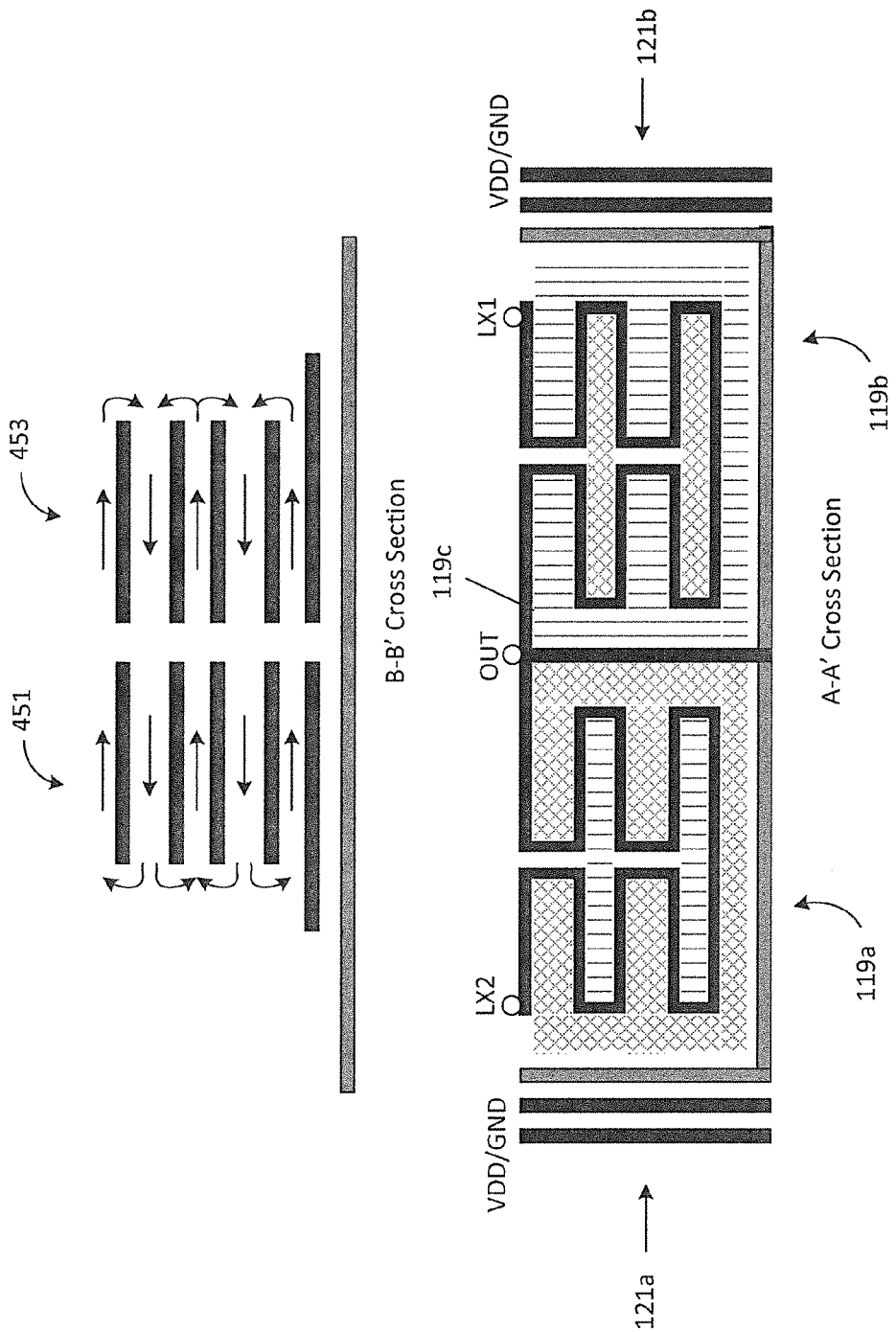
FIG. 5 shows cross-sections of the inductors of FIG. 4, along with magnetic field directions.

For the inductors of FIG. 4, the inductor 119a provides a phase 1, the inductor 119b provides a phase 2, the inductor 419a provides a phase 3, and the inductor 419b provides a phase 4. FIG. 5 shows cross-sections of the inductors of FIG. 4, along with magnetic field directions. For B-B' the magnetic field direction is shown with arrows. For A-A' the magnetic field direction is perpendicular and into the surface of drawing for hatched regions and out of the surface of the drawing for regions filled with parallel lines. As may be seen in FIG. 5, phase 1 and phase 3 run 180 degrees out of phase with each other and they are stacked to allow the magnetic field along B-B' to be in the same direction. This will minimize the change in magnetic field (as they are 180 degrees out of phase). The same holds for phase 2 and phase 4. The output of the four phase switching converter can be taken from the center of the structure providing further core area as the current flow from phase 1 and phase 2 will be from the edge to the center (same for phase 3 and phase 4).

The OUT node 119c at the center can also be a single solid metal region and will have current flow from top to the bottom and this is consistent with the magnetic field lines around it. This will help increase the inductance of the overall 4-phase implementation. A lighter gray lines connecting to the bottom of OUT node and surrounding the structure provide a shield for the entire 4-phase array. For DC-DC converters with BYPASS transistors, the bypass switch is implemented to connect the LXn node to the gray line. VDD and GND connections can be placed outside the gray line which helps reduce the parasitic inductance of the VDD and GND.

Figure 6:
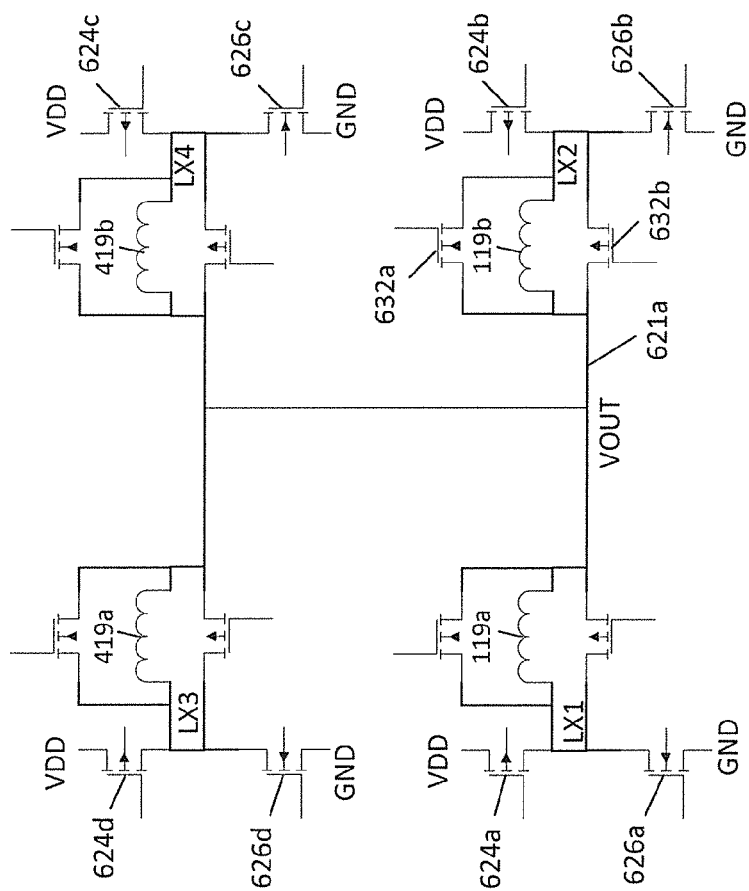
FIG. 6 is a partial circuit diagram of a four phase switching regulator utilizing the inductors of FIG. 4.

FIG. 6 is a partial circuit diagram of a four phase switching regulator utilizing the inductors of FIG. 4. The switching regulator includes the inductors 119a,b and 419a, b. Each of the inductors 119a,b, 419a,b has an output end coupled to Vout 621a, and input ends coupled to nodes between high side switches 624a-d and 626a-d, respectively. In the circuit diagram of FIG. 6, bypass switches are also used to couple the ends of each inductor, for example bypass switches 632a,b each couple ends of the inductor 119b.

Figure 7:
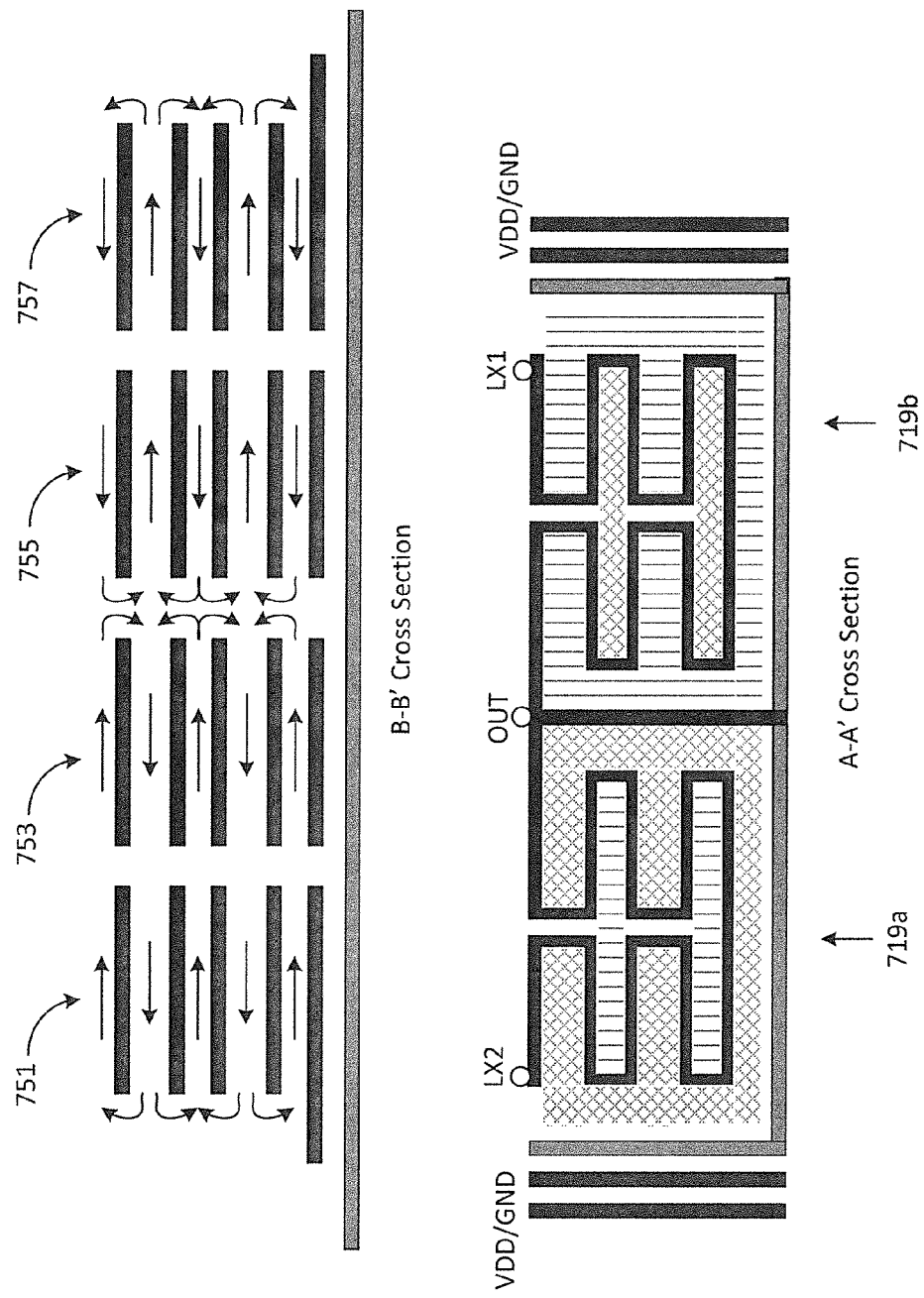
FIG. 7 shows cross-sections for inductor structures for an 8-phase implementation in accordance with aspects of the invention.

FIG. 7 shows cross-sections for inductor structures for an 8-phase implementation in accordance with aspects of the invention. For the inductor structures of FIG. 7, the inductor structure of FIG. 4 is mirrored to further enhance the mutual inductance in between two 4-phase arrays. Thus, with the B-B' cross-section of FIG. 7 correlating to an equivalent B-B' cross-section of FIG. 4, magnetic field direction is indicated by arrows for portions of four inductors 751, 753, 755, and 757, providing for four of the eight phases, with the magnetic field directions providing for mutual inductance between the inductors. For completeness, FIG. 7 also includes a A-A' cross-section, correlating to an equivalent A-A' cross-section of FIG. 4, showing an identical construction for the inductors 719a,b of the inductor structures of FIG. 7.

Figure 8:
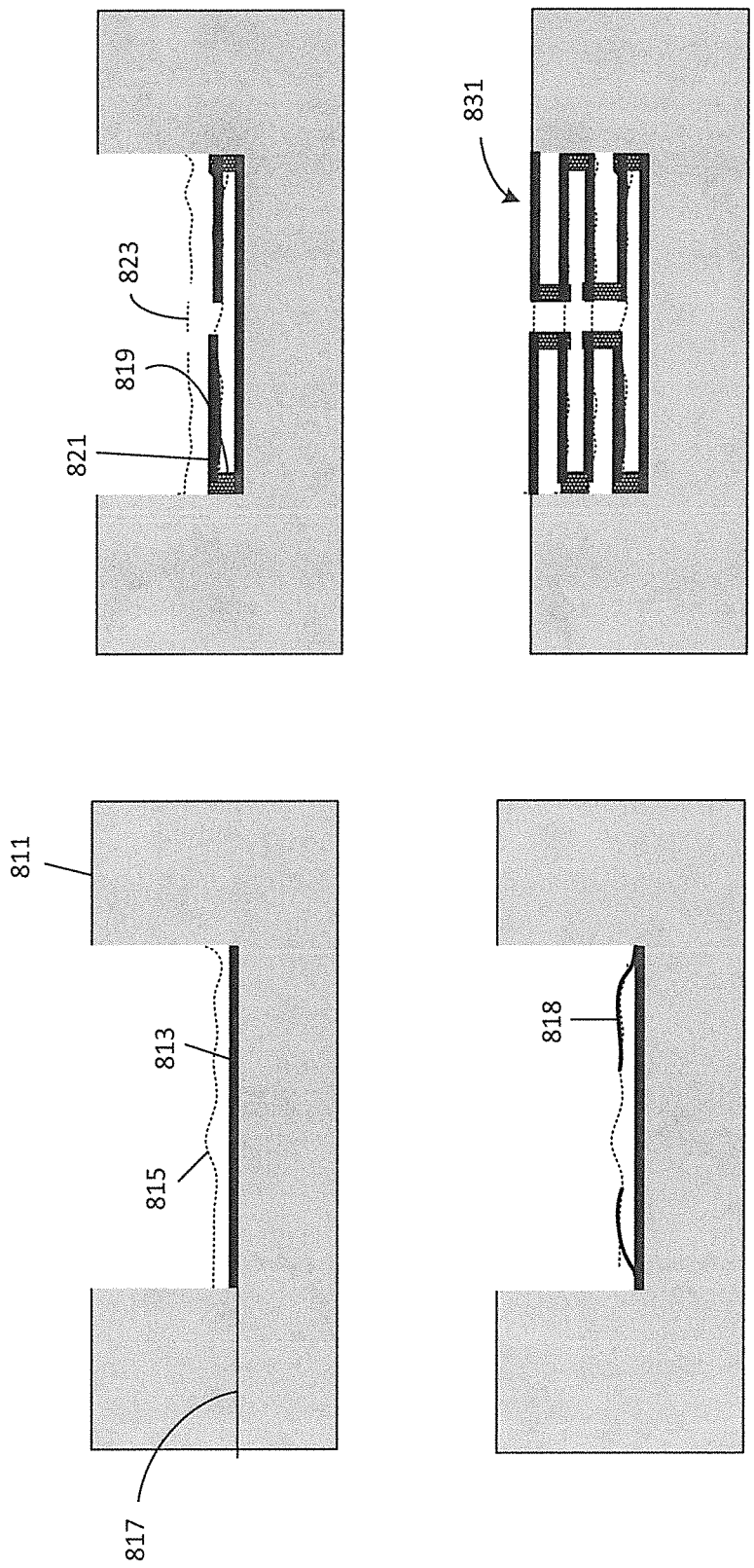
FIG. 8 illustrates steps that may be used to form an inductor structure in accordance with aspects of the invention.

FIG. 8 illustrates steps that may be used to form an inductor structure in accordance with aspects of the invention. The inductor structure is formed in a cavity of a multi-layer package 811. A bias connection 817 may be used for providing bias for electroplating. This is typically used only for electroplating and can be a small trace. The pattern for the copper electroplating can be a thin layer of metal, for example metal 818, deposited and etched for defining the regions where copper will be grown by electroplating. Copper traces, for example copper traces 813, 819, and 821, formed by electroplating may in turn be used for the electrophoretic deposition of ferrite material, for example ferrite material 815, 823. The process is repeated with alternate deposition of copper and ferrite material. A final layer of copper 831 can be polished to create a flat surface at the top of the structure. Hence uniformity and exact thickness of ferrite material is not critical for the final surface to be flat and aligned with the package top surface for bump bonding of the silicon. The deposition of ferrite material does not need to be selective and other deposition techniques can also be used together with electroplating, of copper in between deposition of ferrite layers.

Figure 9:
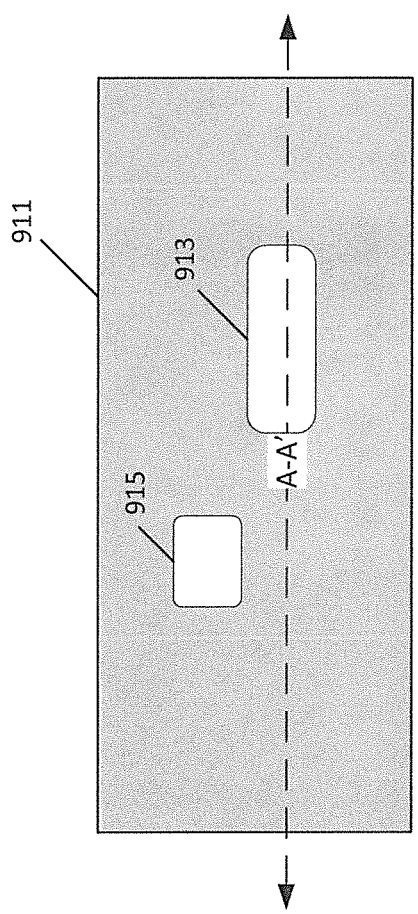
FIG. 9 is a top view of a multi-layer package showing a first cavity for a 2 phase inductor array and a second cavity for a 4 phase inductor array.

In another embodiment in accordance with aspects of the invention, package substrate routing layers may be used for creating an inductor structure, and ferrite material may be deposited in a cavity of each separation layer. FIG. 9 is a top view of a multi-layer package 911 showing a first cavity 915 for a 2 phase inductor array and a second cavity 913 for a 4 phase inductor array. The cavities are substantially rectangular in cross-sectional shape. As shown in FIG. 9, the second cavity, for the 4 phase array, has substantially twice the width of the first cavity, for the 2 phase array.

Figure 10:
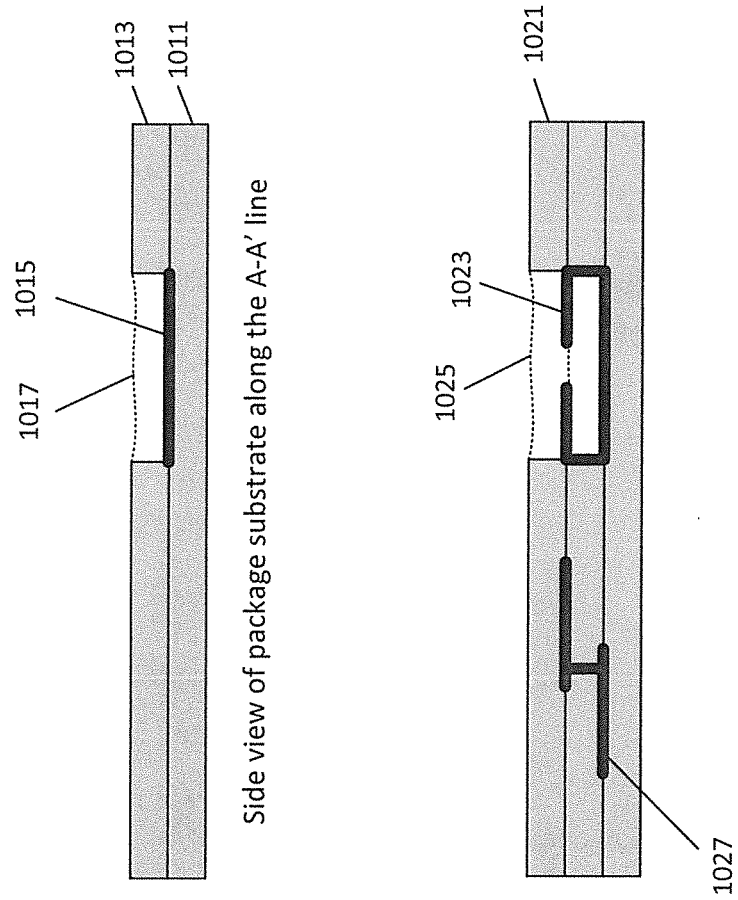
FIG. 10 shows first and second cross-sections of construction of the multi-layer package of FIG. 9.

FIG. 10 shows first and second cross-sections of construction of the multi-layer package of FIG. 9. A first cross-section shows a first layer 1011 and a second layer 1013 of the multi-layer package, with the second layer on top of the first layer. The second layer includes a cavity, which has a copper trace pattern 1015 laying on top of the first layer, with a ferrite deposition 107 on top of the copper trace pattern and filling the cavity.

The second cross-section shows vias along sides of the cavity of the second layer, and a third layer 1021 on top of the second layer. For illustrative purposes, the second cross-section also shows a portion of typical via/metal routing 1027 commonly found in the multi-layer package. The third layer includes a cavity over the cavity of the second layer, with the two cavities having substantially identical dimensions. A further copper trace pattern 1023 is on the ferrite deposition of the cavity of the second layer, and further ferrite 1025 has been deposited in the cavity of the third layer, on top of the further copper trace pattern. In such a fashion, the inductor arrays may be formed, using copper trace patterns and ferrite deposition.

In various embodiments, and as for example mentioned with respect to FIG. 8, a metal trace may be emplaced on a ferrite deposition, with copper then emplaced on the metal trace, for example using electroplating. In some embodiments, a different thickness metal2 trace may be patterned on top of a metal1 pattern before the copper electroplating is applied, with in some embodiments metal1 and metal2 being different metals, which for example may be selectively etched. This creates intentional bumps on the final copper surface and increases the surface area of the layer. This can be helpful when skin effect becomes a dominating factor.

Figure 11:
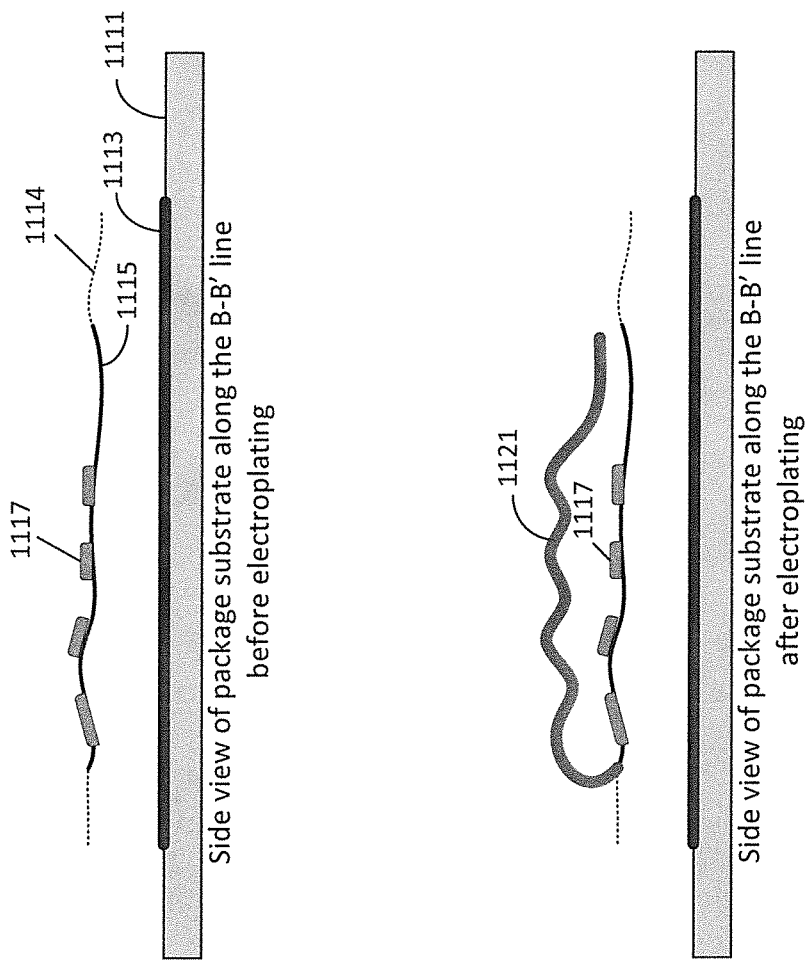
FIG. 11 shows cross-sections of a package illustrating process steps for creating a copper surface with bumps in accordance with some aspects of the invention.

FIG. 11 shows cross-sections of a package illustrating process steps for creating a copper surface with bumps in accordance with some aspects of the invention. A first cross-section of FIG. 11 shows a package substrate 1111 with a base copper layer 1113 on top of the substrate. Ferrite 1114 has been deposited over at least portions of the base copper layer, and a first metal trace pattern 1115 is on top of the ferrite. A second metal trace pattern is over selected portions of the first metal trace pattern, with the second metal trace pattern effectively forming bumps, for example bump 1117, on the first metal trace pattern. In some embodiments the second metal trace pattern is of a different metal than the first metal trace pattern. In some embodiments the different metals may be selectively etched, allowing for increased precision in differences between patterns. In some embodiments one of the metals is a titanium tungsten (TiW) alloy and the other of the metals is aluminum.

A second cross-section of FIG. 11 shows a copper surface 1121 over the metal trace patterns (with extra space between the two shown in FIG. 11 to allow for ease of viewing). The copper surface, which may lie uniformly over the metal trace patterns, includes bumps due to non-uniformities in the second metal trace pattern. The bumps in the copper surface also serves to increase the surface area of the copper surface.

Although the invention has been discussed with respect to various embodiments, it should be recognized that the invention comprises the novel and non-obvious claims supported by this disclosure.

What is claimed is:

1. An integrated chip package comprising:
   a flip-chip type integrated circuit (IC) chip including a system-on-chip (SoC) and a switching voltage regulator, the switching voltage regulator including at least a first switch and a second switch coupled in series between a higher voltage level connection and a lower voltage level connection;
a multi-layer substrate having a cavity with at least one inductor in the cavity, the at least one inductor having a plurality of upper layers of traces interspersed by ferrite material, the inductor including a first end and a second end; and
a plurality of micro-bumps connecting the IC chip to the substrate including a micro-bump connecting a node between the first switch and the second switch to the first end of the inductor.

2. The integrated chip package of claim 1, wherein the voltage regulator is a multi-phase voltage regulator, and the at least one inductor comprises a plurality of inductors.

3. The integrated chip package of claim 2, wherein the voltage regulator includes a plurality of pairs of switches, the pairs of switches including the first switch and the second switch, and an area of the plurality of inductors is the same as an area of the plurality of pairs of switches.

4. The integrated chip package of claim 3, wherein the plurality of inductors are arranged as an array of inductors, with at least pairs of inductors of the arrays of inductors arranged such that direction of magnetic fields of the pairs of inductors are aligned when the pairs of inductors are operated 180 degrees out of phase.

5. The integrated chip package of claim 2, wherein at least some of the copper traces are over at least one metal pattern.

6. The integrated chip package of claim 5, wherein the at least one metal pattern includes bumps.

7. The method of claim 6, wherein the at least one metal pattern comprises two metal patterns.

8. The method of claim 6, wherein the two metal patterns are each of a different metal.

9. A flip-chip package comprising:
a flip-chip type integrated circuit (IC) chip including a system-on-chip (SoC) and a multi-phase voltage regulator, the multi-phase voltage regulator including a first pair of transistors coupled in series and a second pair of transistors coupled in series; and
a multi-layer package substrate having a plurality of redistribution layers and a first inductor and a second inductor, the first inductor and the second inductor formed of a plurality of electroplated traces, each of the first and second inductors including a first end and a second end, the plurality of electroplated traces formed of conductive layers within a cavity of the multi-layer package substrate, ferrite material between at least some of the conductive layers, and wherein at least one of the first plurality of electroplated traces is configured to connect the second end of the first inductor to the first end of the second inductor; and
a plurality of bumps configured to connect the IC chip to the multi-layer package substrate at a plurality of nodes including a supply node, a ground node, a load output node, and inductor nodes, the load output node including the connection between the second end of the first inductor and the first end of the second inductor, the inductor nodes including a node configured to connect a node between the first pair of transistors to the first end of the first inductor structure and a node configured to connect a node between the second pair of transistors to the second end of the second inductor structure.

10. The flip-chip package of claim 9, wherein the multi-phase voltage regulator further includes a third pair of transistors coupled in series and a fourth pair of transistors coupled in series, and
wherein the multi-layer package further has a third inductor and a fourth inductor formed from the plurality of electroplated traces, each of the third and fourth inductors including a first end and a second end, and
wherein the at least one of the first plurality of electroplated traces is further configured to connect the second end of the third inductor to the first end of the fourth inductor.

11. The flip-chip package of claim 10, wherein the multi-phase voltage regulator is a four-phase voltage regulator.

12. The flip-chip package of claim 11, wherein a first phase and a third phase of the four-phase voltage regulator are configured to execute 180 degrees out of phase and a second phase and a fourth phase of the four-phase voltage regulator are configured to execute 180 degrees out of phase.

13. The flip-chip package of claim 9, wherein the plurality of electroplated traces comprise copper.

14. The flip-chip package of claim 9, wherein a size of the first inductor is configured to match a size of each of the first pair of transistors and a size of the second inductor is configured to match a size of each of the second pair of transistors.

* * * * *